United States Patent
May

(10) Patent No.: US 6,211,613 B1
(45) Date of Patent: Apr. 3, 2001

(54) HIGH CONTRAST ELECTROLUMINESCENT DISPLAYS

(75) Inventor: Paul May, Dullingham (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 08/973,322

(22) PCT Filed: Apr. 10, 1997

(86) PCT No.: PCT/GB97/00996

§ 371 Date: Mar. 4, 1998

§ 102(e) Date: Mar. 4, 1998

(87) PCT Pub. No.: WO97/38452

PCT Pub. Date: Oct. 16, 1997

(30) Foreign Application Priority Data

Apr. 10, 1996 (GB) .................................. 9607436
Feb. 4, 1997 (GB) .................................. 9702196

(51) Int. Cl.[7] .................. H01J 1/62; H01J 63/04
(52) U.S. Cl. ............ 313/504; 313/506; 313/507; 313/509
(58) Field of Search ............... 313/501, 502, 313/503, 504, 505, 506, 507, 509, 511, 512

(56) References Cited

U.S. PATENT DOCUMENTS 3,836,230  9/1974  Adams et al. .
5,247,190  9/1993  Friend et al. .
5,478,658  12/1995  Dodabalapur et al. .
5,804,918  * 9/1998  Yazawa et al. ............ 313/509 X
5,831,375  * 11/1998  Benson, Jr. ............... 313/509 X
5,949,187  * 9/1999  Xu et al. ....................... 313/504

FOREIGN PATENT DOCUMENTS

0615401 A1  3/1994  (EP) .
1389737     4/1975  (GB) .
WO 94/15442 A1  7/1994  (WO) .

OTHER PUBLICATIONS

Patent Abstracts of Japan, vol. 095, No. 009, Oct. 31, 1995.

Database WPI/Derwent; Section Ch, Week 9707; Derwent Publications Ltd., London, GB; Class L03, AN 97–074727 for JP 08 321 381 A (Chisso Corp), Dec. 3, 1996 (see Abstract).

* cited by examiner

Primary Examiner—Nimeshkumar D. Patel
Assistant Examiner—Mack Haynes
(74) Attorney, Agent, or Firm—Merchant & Gould P.C.

(57) ABSTRACT

The contrast of an electroluminescent display using an organic EL layer is improved by using a circular polariser in front of the surface. The polariser causes ambient light to be absorbed, while allowing transmission of emitted light and therefore improves the contrast of the display.

40 Claims, 1 Drawing Sheet

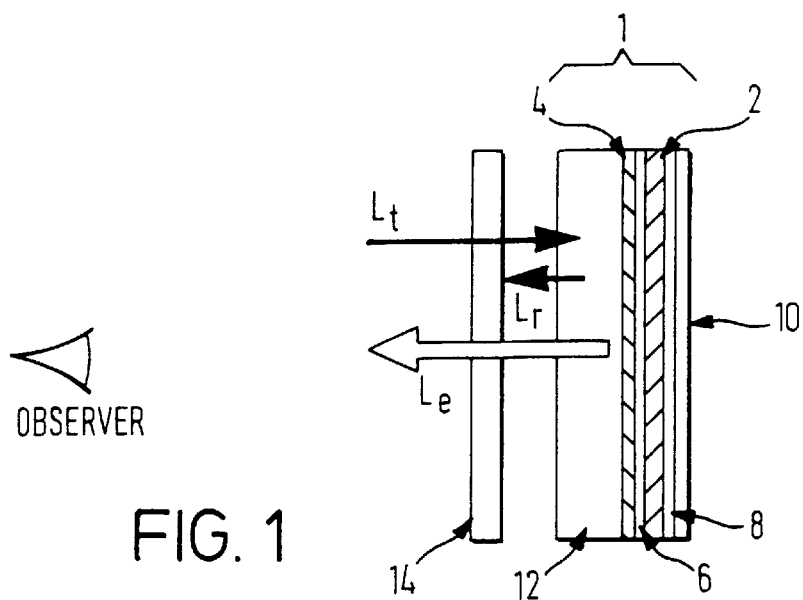
FIG. 1
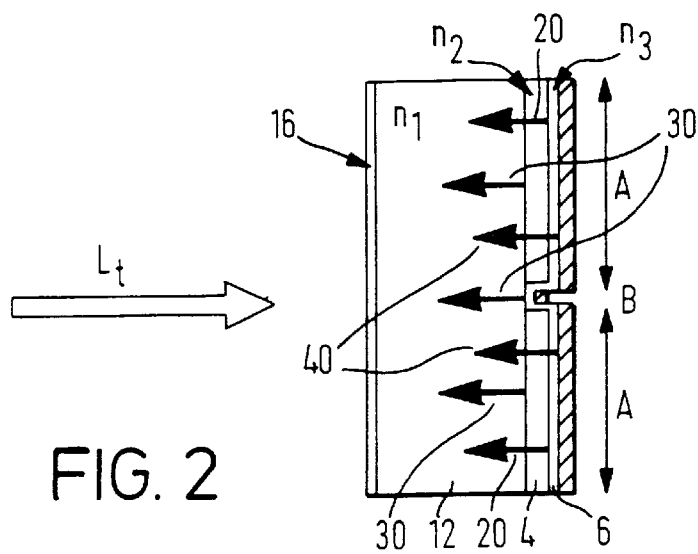
FIG. 2
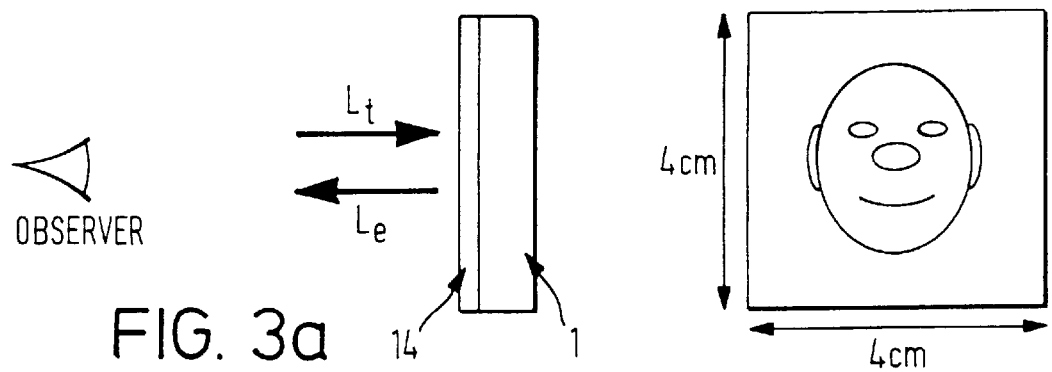
FIG. 3a
FIG. 3b

HIGH CONTRAST ELECTROLUMINESCENT DISPLAYS

FIELD OF THE INVENTION

The field of the invention relates to the use of organic light emitting diodes in displays.

BACKGROUND TO THE INVENTION

The most popular flat panel display technology currently in use is based on liquid crystal devices, which are effectively light shutters used in combination with illumination sources. One of the particular advantages of liquid crystal displays is that the power required to switch the light shutters on and off is relatively low and if the light source used to provide illumination is an ambient one as used in reflective LCD technology, then overall power consumption for the display can be very low. Therefore the technology has great potential for low power portable applications e.g. personal organisers. There are two problems, however. One is the poor angle of view, though for portable applications this is not typically a severe constraint. More importantly, the ability to get full colour displays at reasonable contrast is very limited in reflective displays.

Organic electroluminescent devices are made from materials that emit light when a suitable voltage is applied across electrodes deposited on either side of the organic material. One class of such materials is semiconductive conjugated polymers which have been described in our earlier U.S. Pat. No. 5,247,190, the contents of which are herein incorporated by reference. The power requirements, however, of conjugated polymer EL devices in common with other emissive technologies are all relative high compared to reflective LCD.

The readability of a display depends on many factors but contrast and brightness are the most important. A display can be bright, but not easily readable because the contrast with respect to the non-display area is poor. This can certainly be the case in high ambient light conditions, where reflection of light from both display and non-display areas reduces the contrast of the display. This problem is most common in dynamic displays, i.e. in those displays where certain areas may be switched on or off depending on the nature of the information to be displayed. Conversely a display with high contrast in high ambient light conditions can be readable at a relatively low brightness.

SUMMARY OF THE INVENTION

The aim of the present invention is to provide improved contrast monochrome and colour displays with low power requirements that are suitable for portable display applications, and therefore solve the problems described above.

The contrast in organic EL displays can be improved, allowing a reduction in brightness requirements and therefore power for a given readability, by the use of a circular polariser.

This is placed in front of a display which has a reflective back electrode surface and light that passes through the polariser and is then reflected off the back electrode surface is then completely absorbed by the polariser. The polariser allows transmission of a particular "handedness" of either left-handed or right-handed, but on reflection from a metallic surface this handedness is reversed - such a polariser placed in front of a metallic reflector will cause the reflector to appear dark (see Hecht and Zajac or other standard text on Optics and Flat-Panel Displays and CRTs ed by L. Tannas, Van Nostrand Reinhold p.45). If all the ambient light can be absorbed in this way, much lower brightnesses are needed by the display for a given readability, thus saving power. The extent to which this can be achieved is limited by principally three effects. Firstly off-axis light will not be completely circularly polarised, and therefore will not be completely absorbed on reflection. However, for many portable applications, reflected ambient light will only be problematic typically to the extent that it is on axis (this is a function of the normal viewing arrangement for hand-held devices). Secondly if there is a depolarising element (e.g. birefringent medium) between the circular polariser and the rear electrode this will reduce the elimination effect. For on axis light thin organic films can be regarded as isotropic and therefore have minimal effect. Finally unwanted reflections from surfaces between the polariser and the rear reflector will not undergo the full elimination effect. Antireflection coatings can be used on the polariser to reduce the reflection at this interface. The other main interface for reflections is between the transparent conductive electrode (normally indium tin oxide—ITO) and the transparent substrate (typically glass or plastic) and the organic layer(s) and the ITO.

The present invention provides an electroluminescent display, comprising: an organic light-emitting device including at least one layer of an organic material for emitting radiation of at least one colour arranged between first and second conductive layers which act as electrodes for said light-emitting device, and having a light reflective surface behind the surface of said at least one light-emissive layer opposed to a transparent viewing surface of said light-emitting device; and a circular polarizer disposed in front of the viewing surface of said light-emitting device.

Preferably, said electroluminescent display further comprises a substrate on which said light-emitting device is disposed.

In one embodiment, said substrate comprises said circular polarizer.

In another embodiment, said circular polarizer is disposed in front of the surface of said substrate opposed to said surface on which said light-emitting device is disposed.

In a yet further embodiment, said circular polarizer is disposed on the surface of said substrate opposed to said surface on which said light-emitting device is disposed.

Preferably, said first conductive layer is light transmissive.

More preferably, said first conductive layer comprises indium—tin oxide.

Preferably, said second conductive layer comprises aluminium.

Preferably, at least one of said first and second conductive layers is patterned.

In one embodiment, said second conductive layer provides said light reflective surface.

In another embodiment, said light-emitting device further includes a layer of a light reflecting material disposed behind the surface of said second conductive layer opposed to said at least one light-emissive layer, said light reflecting layer providing said light reflective surface.

Preferably, said light-emitting device further includes a layer of an insulating material disposed between said second conductive layer and said light reflecting layer.

Preferably, said light reflecting layer comprises aluminium.

Preferably, said insulating layer comprises metal oxide.

More preferably, said insulating layer comprises aluminium oxide.

Preferably, said light-emitting device includes a plurality of layers of organic light-emissive material.

Preferably, said light-emissive material comprises a light-emissive polymer.

Preferably, said substrate comprises a glass or a plastics material.

Preferably, the numerical difference in the refractive indices of the materials of said substrate, said at least one light-emissive layer and said first conductive layer is not more than 0.3.

Preferably, the refractive indices of the materials of said substrate, said at least one light-emissive layer and said first conductive layer are similar.

Preferably, the refractive index of said substrate is from 1.45 to 2.00, the refractive index of said at least one light-emissive layer is from 1.6 to 2.3 and the refractive index of said first conductive layer is from 1.5 to 2.5.

Preferably, the refractive index of said substrate is from 1.45 to 1.65, the refractive index of said at least one light-emissive layer is from 1.6 to 2.3 and the refractive index of said first conductive layer is from 1.5 to 2.5.

Preferably, the refractive index of said substrate is from 1.45 to 1.65, the refractive index of said at least one light-emissive layer is from 1.6 to 2.3 and the refractive index of said first conductive layer is from 1.7 to 2.0.

Preferably, the refractive index of said substrate is about 1.5, the refractive index of said at least one light-emissive layer is about 1.7 and the refractive index of said first conductive layer is from 1.5 to 1.8.

Preferably, the refractive index of said substrate is about 1.5, the refractive index of said at least one light-emissive layer is about 1.7 and the refractive index of said first conductive layer is from 1.7 to 1.8.

Preferably, said light-emitting device further includes a layer of non-electroluminescent material disposed between said first conductive layer and said at least one light-emissive layer.

In one embodiment, the electroluminescent display further comprises a filter disposed in front of the viewing surface of said light-emitting device for allowing transmission of radiation from said at least one light-emissive layer and absorbing ambient light from outside of the spectral band of said radiation.

In another embodiment, said substrate comprises a filter for allowing transmission of radiation from said at least one light-emissive layer and absorbing ambient light from outside of the spectral band of said radiation.

Preferably, said circular polarizer includes an antireflection coating on the viewing surface thereof.

Preferably, not more than 1% of on-axis ambient light is reflected.

More preferably, not more than 0.4% of on-axis ambient light is reflected.

Preferably, the ratio of the emissive brightness of said display to the ambient illuminance is 1:10.

Preferably, the output brightness of said light-emitting device is not more than 10 cd/m$^2$.

More preferably, the output brightness of said light-emitting device is not more than 1 cd/m$^2$.

In one embodiment of the invention, an organic electroluminescent display requiring low power to achieve good readability in typical indoor and outdoor light conditions is provided, comprising a circular polariser in combination with an organic electroluminescent device to increase the contrast of the organic electroluminescent device where the metallic cathode of the display provides the reflecting surface required for good contrast.

In another embodiment of the invention an organic electroluminescent display requiring even lower power to achieve good readability in typical indoor and outdoor light conditions is provided, comprising an organic electroluminescent display as described in the previous aspect where the refractive index of the transparent electrode layer is chosen to reduce reflections between the transparent electrode and the transparent substrate, and the organic electroluminescent layer and the transparent conducting layer. In a particular embodiment it is chosen to be between the index of the transparent substrate and the index of the organic layer. For complete elimination of reflection at these interfaces all three refractive indices are identical.

In another embodiment of the invention an organic electroluminescent display requiring yet even lower power to achieve good readability in typical indoor and outdoor light conditions is claimed, comprising an organic electroluminescent display as described in the previous aspect together with a filter placed in front of the transparent substrate that allows transmission of the electroluminescence from the organic electroluminescent device, but absorbs ambient light outside this electroluminescent spectral band.

An embodiment that provides a simplification of the structure is possible by deposition of the transparent conducting electrode layer directly on the polariser—i.e. the polariser is used as the substrate.

An embodiment utilises a light emitting polymer as the organic electroluminescent layer.

An embodiment utilises two or more organic layers between the electrodes of the electroluminescent device, with small refractive index different between the organic layers.

An embodiment utilises two or more organic layers between the electrodes of the electroluminescent device, with small refractive index difference between the organic layers, and with a non-electroluminescent layer in contact with the transparent conductive electrode.

An embodiment utilises a separate reflector placed behind the cathode, such that if any of the cathode is patterned, the light is still reflected from the areas without the cathode layer.

For a better understanding of the present invention and to show how the same may be carried into effect, reference will now be made by way of example to the accompanying drawings.

BRIEF DESCRIPTION OF THE DRAWINGS

FIG. 1 shows an LEP (light emitting polymer) display with a circular polariser;

FIG. 2 shows the light reflections in a device; and

FIGS. 3a and 3b are side and front views of a low power display.

A light emitting polymer device that is designed to have good visibility at low power consumption in high ambient light conditions is shown in FIGS. 1 to 3. FIG. 1 illustrates a device structure comprising an aluminium cathode 2 acting as a back electrode and a transparent anode for example of indium tin oxide 4 acting as a front electrode. Between the front and back electrodes 2,4 is arranged one or more polymer layer 6, for example of a semiconductive conjugated polymer of the type described in U.S. Pat. No. 5,247,190. The back electrode 2 can also carry a layer of insulator 8 such as aluminium oxide. If the cathode 2 is wholly reflective to light incident on the front surface of the display, then that would complete the device structure. However, if the cathode is not reflective, an additional reflective layer 10 may be provided, for example of aluminium. A transparent substrate 12, for example of glass, lies adjacent the front electrode 4. As a matter of practice, the device structure can be fabricated by starting from the glass substrate 12 and depositing subsequent layers 4,6,2,8 and, optionally, 10 subsequently. Other methods of manufacture are possible.

Reference numeral 14 denotes a circular polariser which is placed in front of the glass substrate 12. The effect of the circular polariser can be seen by considering the arrows denoting transmitted, reflected and emitted light. The arrow denoted $L_t$ denotes transmitted ambient light incident on the front surface of the display. The arrow $L_r$ denotes ambient light which is reflected from the display and which is blocked by the circular polariser. The arrow $L_e$ denotes light emitted from the display which is not blocked by the circular polariser. Thus, the contrast of the display is increased.

In FIG. 2, $n_1$, $n_2$ and $n_3$, denotes the refractive indices respectively of the glass substrate 12, the transparent front electrode 4, and the polymer layer or layers 6. Typically:

$n_1=1.5$
$n_2=1.7$
$n_3=1.7$.

Reference numeral 20 indicates arrows which indicate unwanted reflections from the interface between the transparent front electrode and the polymer layer. Reference numeral 30 denotes arrows which indicate unwanted reflections from the interface between the glass substrate and the transparent front electrode. Reference numeral 40 denotes reflections from the back electrode 2. Reference numeral 16 denotes an antireflection coating placed on the viewing surface of the glass substrate 12. In the display of FIG. 2, the indium tin oxide layer 4 is interrupted to provide individually actuatable regions of the display. The size and function of these regions can vary, but in many displays the interruption of the indium tin oxide layer will define pixels for the display. In FIG. 2, there are thus indicated two separate regions of the display A and B. Region A represents the area where the indium tin oxide layer is present and region B represents the part of the display where the indium tin oxide layer has been interrupted.

In region A, it can be calculated that the unwanted reflections are represented by the following equation:

$$\frac{(n_2 - n_1)^2}{(n_1 + n_2)^2} + \left\{1 - \frac{(n_2 - n_1)^2}{(n_1 + n_2)^2}\right\} \frac{(n_2 - n_3)^2}{(n_2 + n_3)^2} \qquad \text{Equation 1}$$

In region B, the unwanted reflections can be represented by the following equation:

$$\frac{(n_3 - n_1)^2}{(n_1 + n_3)^2} \qquad \text{Equation 2}$$

With the values for the refractive indices given above, the level of unwanted reflections is about 0.4%.

For an ambient luminance of 100 cd/sqm, typical for ambient indoor conditions (either daylight or natural lighting), and assuming an emission brightness of 1 cd/sqm (i.e. 100× smaller than that which would be generally acceptable for indoor daylight viewing), the maximum allowed reflection of on-axis ambient light should be 1%. With a refractive index of glass of n=1.5, and of the polymer n=1.7, then the index of the ITO for <1% reflectivity is n=1.5–1.8, though for reasonable conductivity n=1.7 is a practical minimum value. With an LEP power efficiency of 5%, and at wavelengths close to 550 nm, the light output brightness of 1 cd/sqm corresponds to an output power of about 5 mW/sqm (assuming lambertian emission) and therefore an electrical power requirement of 100 mW/sqm. For a 4×4 cm display shown in FIGS. 3a and 3b this corresponds to ~1.5 mW. At 5V drive this power can be supplied for over 300 operating hours from an appropriate thin profile 100 mAhr battery (e.g. the kind of capacity provided by watch or camera batteries), or for over 3000 operating hours from a 1Ahr battery (e.g. the kind of capacity provided by mobile phone batteries)—assuming of course little battery drain from other electronic functions.

What is claimed is:

1. An electroluminescent display, comprising:
   an organic light-emitting device including at least one layer of an organic material for emitting radiation of at least one colour arranged between first and second conductive layers which act as electrodes for said light-emitting device, and having a light reflective surface behind the surface of said at least one light-emissive layer opposed to a transparent viewing surface of said light-emitting device;
   a circular polarizer disposed in front of the viewing surface of said light-emitting device; and
   a substrate on which said light-emitting device is disposed, wherein the numerical difference in the refractive indices of the materials of said substrate, said at least one light-emissive layer and said first conductive layer is not more than 0.3.

2. An electroluminescent display according to claim 1, wherein said substrate comprises said circular polarizer.

3. An electroluminescent display according to claim 1, wherein said circular polarizer is disposed in front of the surface of said substrate opposed to said surface on which said light-emitting device is disposed.

4. An electroluminescent display according to claim 1, wherein said circular polarizer is disposed on the surface of said substrate opposed to said surface on which said light-emitting device is disposed.

5. An electroluminescent display according to claim 1, wherein said first conductive layer is light transmissive.

6. An electroluminescent display according to claim 1, wherein said first conductive layer comprises indium—tin oxide.

7. An electroluminescent display according to claim 1, wherein said second conductive layer comprises aluminium.

8. An electroluminescent display according to to claim 1, wherein at least one of said first and second conductive layers is patterned.

9. An electroluminescent display according to to claim 1, wherein said second conductive layer provides said light reflective surface.

10. An electroluminescent display according to claim 1, wherein said light-emitting device further includes a layer of a light reflecting material disposed behind the surface of said second conductive layer opposed to said at least one light-emissive layer, said light reflecting layer providing said light reflective surface.

11. An electroluminescent display according to claim 10, wherein said light-emitting device further includes a layer of an insulating material disposed between said second conductive layer and said light reflecting layer.

12. An electroluminescent display according to claim 11, wherein said light reflecting layer comprises aluminium.

13. An electroluminescent display according to claim 11, wherein said insulating layer comprises metal oxide.

14. An electroluminescent display according to claim 13, wherein said insulating layer comprises aluminium oxide.

15. An electroluminescent display according to to claim 1, wherein said light-emitting device includes a plurality of layers of organic light-emissive material.

16. An electroluminescent display according to claim 1, wherein said light-emissive material comprises a light-emissive polymer.

17. An electroluminescent display according to claim 1, wherein said substrate comprises a glass or a plastics material.

18. An electroluminescent display according to claim 2, further comprising a filter disposed in front of the viewing surface of said light-emitting device for allowing transmission of radiation from said at least one light-emissive layer and absorbing ambient light from outside of the spectral band of said radiation.

19. An electroluminescent display according to claim 1, wherein said substrate comprises a filter for allowing transmission of radiation from said at least one light-emissive layer and absorbing ambient tight from outside of the spectral band of said radiation.

20. An electroluminescent display according to claim 1, wherein said circular polarizer includes an anti-reflection coating on the viewing surface thereof.

21. An electroluminescent display, comprising:
an organic light-emitting device including at least one layer of an organic material for emitting radiation of at least one color arranged between first and second conductive layers which act as electrodes for said light-emitting device, and having a light reflective surface behind the surface of said at least one light-emissive layer opposed to a transparent viewing surface of said light-emitting device;
a circular polarizer disposed in front of the viewing surface of said light-emitting device; and
a substrate on which said light-emitting device is disposed, wherein the refractive indices of the materials of said substrate, said at least one light-emissive layer and said first conductive layer are similar.

22. An electroluminescent display according to claim 21, further comprising a filter disposed in front of the viewing surface of said light-emitting device for allowing transmission of radiation from said at least one light-emissive layer and absorbing ambient light from outside of the spectral band of said radiation.

23. An electroluminescent display according to claim 21, wherein said substrate comprises a filter for allowing transmission of radiation from said at least one light-emissive layer and absorbing ambient light from outside of the spectral band of said radiation.

24. An electroluminescent display according to claim 21, wherein said circular polarizer includes an anti-reflection coating on the viewing surface thereof.

25. An electroluminescent display comprising:
an organic light-emitting device including at least one layer of an organic material for emitting radiation of at least one color arranged between first and second conductive layers which act as electrodes for said light-emitting device and having a light reflective surface behind the surface of said at least one light-emissive layer opposed to a transparent viewing surface of said light-emitting device;
a circular polarizer disposed in front of the viewing surface of said light-emitting device; and
a substrate on which said night-emitting device is disposed, wherein the refractive index of said substrate is from 1.45 to 2.00, the refractive index of said at least one light-emissive layer is from 1.6 to 2.3 and the refractive index of said first conductive layer is from 1.5 to 2.5.

26. An electroluminescent display according to claim 25, further comprising a filter disposed in front of the viewing surface of said light-emitting device for allowing transmission of radiation from said at least one light-emissive layer and absorbing ambient light from outside of the spectral band of said radiation.

27. An electroluminescent display according to claim 25, wherein said substrate comprises a filter for allowing transmission of radiation from said at least one light-emissive layer and absorbing ambient light from outside of the spectral band of said radiation.

28. An electroluminescent display according to claim 25, wherein said circular polarizer includes an anti-reflection coating on the viewing surface thereof.

29. An electroluminescent display according to claim 25, wherein the refractive index of said substrate is from 1.45 to 1.65.

30. An electroluminescent display according to claim 29, wherein the refractive index of said substrate is about 1.5, the refractive index of said at least one light-emissive layer is about 1.7 and the refractive index of said first conductive layer is from 1.5 to 1.8.

31. An electroluminescent display according to claim 29, wherein the refractive index of said first conductive layer is from 1.7 to 2.0.

32. An electroluminescent display according to claim 31, wherein the refractive index of said substrate is about 1.5, the refractive index of said at least one light-emissive layer is about 1.7 and the refractive index of said first conductive layer is from 1.7 to 1.8.

33. An electroluminescent display, compromising:
an organic light-emitting device including at least one layer of an organic material for emitting radiation of at least one color arranged between first and second conductive layers which act as electrodes for said light-emitting device, and having a light-reflective surface behind the surface of said at least on light-emissive layer opposed to a transparent viewing surface of said light-emitting device, and a circular polarizer disposed in front of the viewing surface of said light-emitting device; wherein said light-emitting device further includes a layer of non-electroluminescent material disposed between said first conductive layer and said at least one light-emissive layer.

34. An electroluminescent display according to claim 33, further comprising a filter disposed in front of the viewing surface of said light-emitting device for allowing transmission of radiation from said at least one light-emissive layer and absorbing ambient light from outside of the spectral band of said radiation.

35. An electroluminescent display according to claim 33, wherein said circular polarizer includes an anti-reflection coating on the viewing surface thereof.

36. An electroluminescent display, comprising:
an organic light-emitting device including at least one layer of an organic material for emitting radiation of at least one color arranged between first and second conductive layers which act as electrodes for said light-emitting device, and having a light reflective surface behind the surface of said at least one light-emissive layer opposed to a transparent viewing surface of said light-emitting device; and a circular polarizer disposed in front of the viewing surface of said light-emitting device; wherein not more than 1% of on-axis ambient light is reflected.

37. An electroluminescent di splay according to claim 36, wherein not more than 0.4% of on-axis ambient light is reflected.

38. An electroluminescent display, comprising:

an organic light-emitting device including at least one layer of an organic material for emitting radiation of at least one color arranged between first and second conductive layers which act as electrodes for said light-emitting device, and having a light reflective surface behind the surface of said at least one light-emissive layer opposed to a transparent viewing surface of said light-emitting device; and a circular polarizer disposed in front of the viewing surface of said light-emitting device; wherein the ratio of the emissive brightness of said display to the ambient illuminance is 1:10.

39. An electroluminescent display, comprising:

an organic light-emitting device including at least one layer of an organic material for emitting radiation of at least one color arranged between first and second conductive layers which act as electrodes for said light-emitting device, and having a light reflective surface behind the surface of said at least one light-emissive layer opposed to a transparent viewing surface of said light-emitting device; and a circular polarizer disposed in front of the viewing surface of said light-emitting device; wherein the output brightness of said light-emitting device is not more than 10 cd/m$^2$.

40. An electroluminescent display according to claim 39, wherein the output brightness of said light-emitting device is not more than 1 cd/m$^2$.

* * * * *

UNITED STATES PATENT AND TRADEMARK OFFICE
CERTIFICATE OF CORRECTION

PATENT NO.     : 6,211,613 B1
DATED          : April 3, 2001
INVENTOR(S)    : May It is certified that error appears in the above-identified patent and that said Letters Patent is hereby corrected as shown below:

<u>Column 7,</u>
Line 18, "claim 2" should read -- claim 1 --

Signed and Sealed this

Twenty-first Day of January, 2003

JAMES E. ROGAN
*Director of the United States Patent and Trademark Office*